United States Patent
Lee

(10) Patent No.: US 9,922,998 B2
(45) Date of Patent: Mar. 20, 2018

(54) DISPLAY APPARATUS AND METHOD OF MANUFACTURING THE SAME

(71) Applicant: LG Display Co., Ltd., Seoul (KR)

(72) Inventor: YongSuk Lee, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/161,446

(22) Filed: May 23, 2016

(65) Prior Publication Data

US 2017/0092664 A1 Mar. 30, 2017

(30) Foreign Application Priority Data

Sep. 25, 2015 (KR) .................. 10-2015-0136154

(51) Int. Cl.
*H01L 27/12* (2006.01)

(52) U.S. Cl.
CPC ........ *H01L 27/1248* (2013.01); *H01L 27/124* (2013.01); *H01L 27/1259* (2013.01); *H01L 27/1288* (2013.01)

(58) Field of Classification Search
CPC ............. H01L 27/1248; H01L 27/1259; H01L 27/124; H01L 27/1288
USPC .......................................................... 257/72
See application file for complete search history.

(56) References Cited

U.S. PATENT DOCUMENTS

| | | | | |
|---|---|---|---|---|
| 2010/0149473 A1* | 6/2010 | Guo | ............ | G02F 1/1345 349/122 |
| 2011/0049519 A1* | 3/2011 | Kim | ............ | G02F 1/13624 257/59 |
| 2014/0147976 A1* | 5/2014 | Shim | ............ | H01L 27/1288 438/158 |
| 2015/0103265 A1* | 4/2015 | Kim | ............ | G06F 3/0412 349/12 |
| 2015/0318315 A1* | 11/2015 | Su | ............ | H01L 27/1288 257/72 |

* cited by examiner

*Primary Examiner* — Yasser A Abdelaziez
(74) *Attorney, Agent, or Firm* — Morgan, Lewis & Bockius LLP

(57) ABSTRACT

A display apparatus is provided. The display apparatus includes a substrate having a display area and a pad area, an active layer in the display area of the substrate, a pad electrode in the pad area of the substrate, and a planarization layer on the active layer and the pad electrode with a contact hole for exposing a part of the active layer. A maximum diameter of the contact hole has a size considering an increase in maximum diameter of the contact hole while the planarization layer in the pad area is removed after the planarization layer is formed on the display area and the pad area. Accordingly, it is possible to minimize an increase in size of the contact hole in the display area while the planarization layer is removed, thereby reducing process defects, such as a gap error, of the display apparatus.

12 Claims, 12 Drawing Sheets

|  | COMPARATIVE EXAMPLE | EXAMPLE 1 | EXAMPLE 2 |
|---|---|---|---|
| MAXIMUM DIAMETER OF CNT1 BEFORE REMOVING PLANARIZATION LAYER ON PAD AREA | 3.5 μm | 3.5 μm | 3.5 μm |
| MAXIMUM DIAMETER OF CNT1 AFTER REMOVING PLANARIZATION LAYER ON PAD AREA | 5.5 μm | 4.15 μm | 3.87 μm |

FIG. 5

DISPLAY APPARATUS AND METHOD OF MANUFACTURING THE SAME

CROSS-REFERENCE TO RELATED APPLICATIONS

This application claims the priority of Korean Patent Application No. 10-2015-0136154 filed on Sep. 25, 2015, in the Korean Intellectual Property Office, the disclosure of which is incorporated herein by reference.

BACKGROUND

Field

The present disclosure relates to a display apparatus and a method of manufacturing the same and more particularly, to a display apparatus and a method of manufacturing the display apparatus which is improved in driving defect and process defect by forming a planarization layer on a pad area to have a different thickness from that of a planarization layer on a display area using a mask including at least one semi-transparent area.

Description of the Related Art

A display apparatus is configured to display images. The display apparatus can be implemented in various manners such as liquid crystal display (LCD), plasma display panel (PDP), electro luminescent display (ELD), vacuum fluorescent display (VFD), and organic light emitting display (OLED). Further, with the development of the information society, various demands for display apparatuses have been increasing. Accordingly, studies are being continuously conducted to apply the display apparatus to various devices, such as televisions, mobile devices, notebook computers, vehicles, and watches, in various manners.

A display apparatus includes at least one thin film transistor (TFT) for driving a pixel in a display area. Further, the display apparatus includes a plurality of pads, which can be connected to an external circuit, in a non-display area in order to transfer various signals to the TFT and the pixel.

The TFT and the pad can be formed through a semiconductor processor. For example, layers constituting the TFT and the pad may be formed through exposing, developing, and etching processes using a mask. Herein, while the TFT or the pad is formed, the etching process is performed many times. Therefore, various problems may occur. Specifically, while the TFT or the pad including a plurality of layers is formed, layers or electrodes constituting the TFT or the pad or a contact hole connecting layers may be damaged by the etching process which is performed many times. Details thereof will be described with reference to FIG. 1, FIG. 2A, and FIG. 2B.

FIG. 1 is a cross-sectional view provided to explain a typical display apparatus 10 and a method of manufacturing the same.

A substrate 1 of the display apparatus 10 includes a display area DA where images are displayed and at least one TFT is formed, and a non-display area where images are not displayed. Further, at least a part of the non-display area includes a pad area PA where a plurality of pads connected to an external circuit is formed. FIG. 1 illustrates only the display area DA where the TFT is formed and the pad area PA where the plurality of pads is formed for convenience in explanation. The TFT includes an active layer 2, a gate electrode 4, a source electrode, and a drain electrode. The pad includes a pad electrode 5 connected to the external circuit. FIG. 1 illustrates a step before the source electrode and the drain electrode are formed during a process of forming the TFT and the pad. Therefore, in FIG. 1, the source electrode and the drain electrode of the TFT are not illustrated.

The TFT and the pad illustrated in FIG. 1 can be formed in the display area DA and the pad area PA, respectively, at the same time through the same process in order to increase the efficiency of a manufacturing process. Specifically, the active layer 2 is formed in the display area DA of the substrate 1, and then a first insulation layer 3 is formed throughout the display area DA and the pad area PA. Then, the gate electrode 4 is formed on the first insulation layer 3 in the display area DA at the same time when the pad electrode 5 is formed on the first insulation layer 3 in the pad area PA. Then, a second insulation layer 6 is formed so as to cover the gate electrode 4 and the pad electrode 5. Thereafter, a planarization layer 7 is formed on the second insulation layer 6 in the display area DA. Then, a first contact hole CNT1 for exposing a part of the active layer 2 is formed in the planarization layer 7 and the second insulation layer 6 in the display area DA. At the same time, a second contact hole CNT2 for exposing a part of the pad electrode 5 is formed in the second insulation layer 6 in the pad area PA. The first contact hole CNT1 and the second contact hole CNT2 can be formed through a developing process to the planarization layer 7 and an etching process E to the first insulation layer 3 or the second insulation layer 6. Specifically, a portion of the planarization layer 7 corresponding to the first contact hole CNT1 may be removed through the developing process. Then, the first insulation layer 3 and the second insulation layer 6 corresponding to the first contact hole CNT1 in the display area DA and the second insulation layer 6 corresponding to the second contact hole CNT2 in the pad area PA may be removed through the etching process E.

In this case, while the first contact hole CNT1 and the second contact hole CNT2 are formed through the etching process E, the second insulation layer 6 in the pad area PA may be damaged. Specifically, if the etching process E is performed to form the first contact hole CNT1 and the second contact hole CNT2, the entire second insulation layer 6 in the pad area PA may be exposed to an etching material (or etchant). That is, as for the second insulation layer 6, not only a portion corresponding to the second contact hole CNT2 but also the entire second insulation layer 6 is exposed to the etchant. Therefore, an undesired portion of the second insulation layer 6 may be removed or a thickness of the second insulation layer 6 may be excessively reduced. Therefore, a surface of the pad electrode 5 may be damaged. If the surface of the pad electrode 5 is damaged, adhesion between the pad electrode 5 and the external circuit may be reduced. Accordingly, there may be an increase in driving defect of the display apparatus 10.

FIG. 2A and FIG. 2B are cross-sectional views provided to explain another typical display apparatus 20 and a method of manufacturing the same.

Referring to FIG. 2A, the planarization layer 7 is formed throughout the display area DA and the pad area PA. In this case, it is possible to reduce the above-described problem of damage to the second insulation layer 6 or the pad electrode 5 in the pad area PA caused by exposure of the entire second insulation layer 6 in the pad area PA to the etching material. However, while a planarization layer 7p in the pad area PA is removed, other problems may occur. Details thereof will be described below.

After the etching process E for forming the first contact hole CNT1 and the second contact hole CNT2, the planarization layer 7p in the pad area PA may not be removed.

If so, while the external circuit is bonded to the pad electrode 5, there may be a contact error due to a large thickness of the planarization layer 7p. Therefore, after the first contact hole CNT1 and the second contact hole CNT2 are formed, the planarization layer 7p in the pad area PA needs to be removed.

Referring to FIG. 2B, the planarization layer 7p in the pad area PA may be removed through an ashing process A. The ashing process A refers to a process for decomposing or removing organic materials such as a photo resist residue or a polymer using oxygen ($O_2$) and etc.

However, the problem is that while the planarization layer 7p in the pad area PA is removed, a size of the first contact hole CNT1 formed in the display area DA may be excessively increased. Specifically, the planarization layer 7 needs to be formed to a larger thickness than the insulation layers 3 and 6 in order to flatten upper parts of the plurality of layers disposed under the planarization layer 7. Herein, as the thickness of the planarization layer 7 is increased, a time for the ashing process A for removing the planarization layer 7p in the pad area PA may also be increased. If the ashing process A is continued for a long time, a planarization layer 7d in the display area DA may also be affected. That is, while the planarization layer 7p in the pad area PA is removed by the ashing process A, a part of the planarization layer 7d in the display area DA may also be removed. Thus, as illustrated in FIG. 2B, a size of the first contact hole CNT1 may be excessively increased, or a thickness of the planarization layer 7d in the display area DA may be smaller than a target value.

If the thickness of the planarization layer 7d in the display area DA is reduced, upper parts of the plurality of layers disposed under the planarization layer 7d may not be sufficiently flattened. Further, if the size of the first contact hole CNT1 is excessively greater than a design value, after the source or drain electrode connected to the active layer 2 is formed, an unnecessary space for the first contact hole CNT1 remains. Thus, additional defects may occur. For example, a structure such as a column spacer for maintain a cell gap of a liquid crystal layer included in the display apparatus 20 may be disposed in a peripheral area of the first contact hole CNT1 according to a design of the display apparatus 20. In this case, if a size of the first contact hole CNT1 is greater than a design value, a part of the structure may sink into the contact hole, and, thus, the structure may be out of alignment, which is called "gap error". Further, a part of the pad electrode 5 exposed through the second contact hole CNT2 may be continuously exposed to oxygen ($O_2$) and others during the ashing process A. Thus, the surface of the pad electrode 5 may be damaged, which may result in a decrease in adhesion between the pad electrode 5 and the external circuit.

In order to solve the above-described problems, the planarization layer 7 may be formed to have a larger thickness considering a margin of the planarization layer 7d in the display area DA which is removed by the ashing process A. However, in this case, the thickness of the planarization layer 7p in the pad area PA is also increased. Therefore, the ashing process needs to be performed for a longer time. As a process time or a time for the ashing process A is increased, the contact holes CNT1 and CNT2 may be further damaged. Accordingly, this may not be a fundamental solution.

The inventors of the present disclosure invented a display apparatus and a method of manufacturing the same. In the display apparatus, a structure of the planarization layer 7p in the pad area PA and a method of forming the same are optimized. Therefore, it is possible to suppress damage to the pad electrode 5 or the second insulation layer 6 during an etching process, and also possible to minimize damage to the contact holes CNT1 and CNT2 in the display area DA during the ashing process A.

SUMMARY

Accordingly, the present disclosure is directed to a display apparatus and a method of manufacturing the same that substantially obviate one or more of the problems due to limitations and disadvantages of the related art.

An object of the present disclosure is to provide a display apparatus and a method of manufacturing the same. In the display apparatus, a planarization layer in a pad area is formed to have a smaller thickness than a planarization layer in a display area. Therefore, it is possible to suppress damage to a pad electrode or an insulation layer in the pad area caused by an etching process, and also possible to improve an excessive increase in size of a contact hole formed in the display area.

Another object of the present disclosure is to provide a display apparatus and a method of manufacturing the same. In the display apparatus, a planarization layer in a pad area is formed to have a shape and a thickness considering a thickness of a pad electrode formed in a pad area. Therefore, it is possible to minimize an increase in size of a contact hole in a display area while the planarization layer is removed.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

To achieve these and other advantages and in accordance with the purpose of the present disclosure, as embodied and broadly described, a method of manufacturing a display apparatus, comprises forming an active layer in a display area of a substrate, respectively forming a gate electrode and a pad electrode in the display area and a pad area of the substrate, forming a planarization layer so as to cover the gate electrode and the pad electrode, forming a contact hole in the planarization layer so as to expose a part of the active layer, and removing the planarization layer in the pad area. The forming of the planarization layer according to an exemplary embodiment of the present disclosure includes forming the planarization layer in the pad area to have a smaller thickness than that of the planarization layer in the display area. Accordingly, it is possible to reduce damage to the pad electrode or an insulation layer in the pad area caused by an etching process. Further, it is possible to improve an excessive increase in size of a contact hole in the display area while the planarization layer in the pad area is removed.

In another aspect, a display apparatus comprises a substrate including a display area and a pad area, an active layer in the display area of the substrate, a pad electrode in the pad area of the substrate, and a planarization layer on the active layer and the pad electrode and including a contact hole for exposing a part of the active layer. A maximum diameter of the contact hole has a size considering an increase in maximum diameter of the contact hole while the planarization layer in the pad area is removed after the planarization layer is formed on the display area and the pad area. The size is 4.15 μm or less. Accordingly, it is possible to minimize an increase in size of the contact hole in the display area while the planarization layer is removed. Thus, it is possible to reduce process defects, such as a gap error, of the display apparatus. Further, it is possible to minimize damage to the pad electrode while the planarization layer is removed. Thus, it is possible to reduce driving defects of the display apparatus caused by the damage.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings:

FIG. 5 is a table comparing maximum diameters of a contact hole before and after removing a planarization layer in a pad area according to Comparative Example and Examples of the present disclosure.

DETAILED DESCRIPTION

Figure 1:
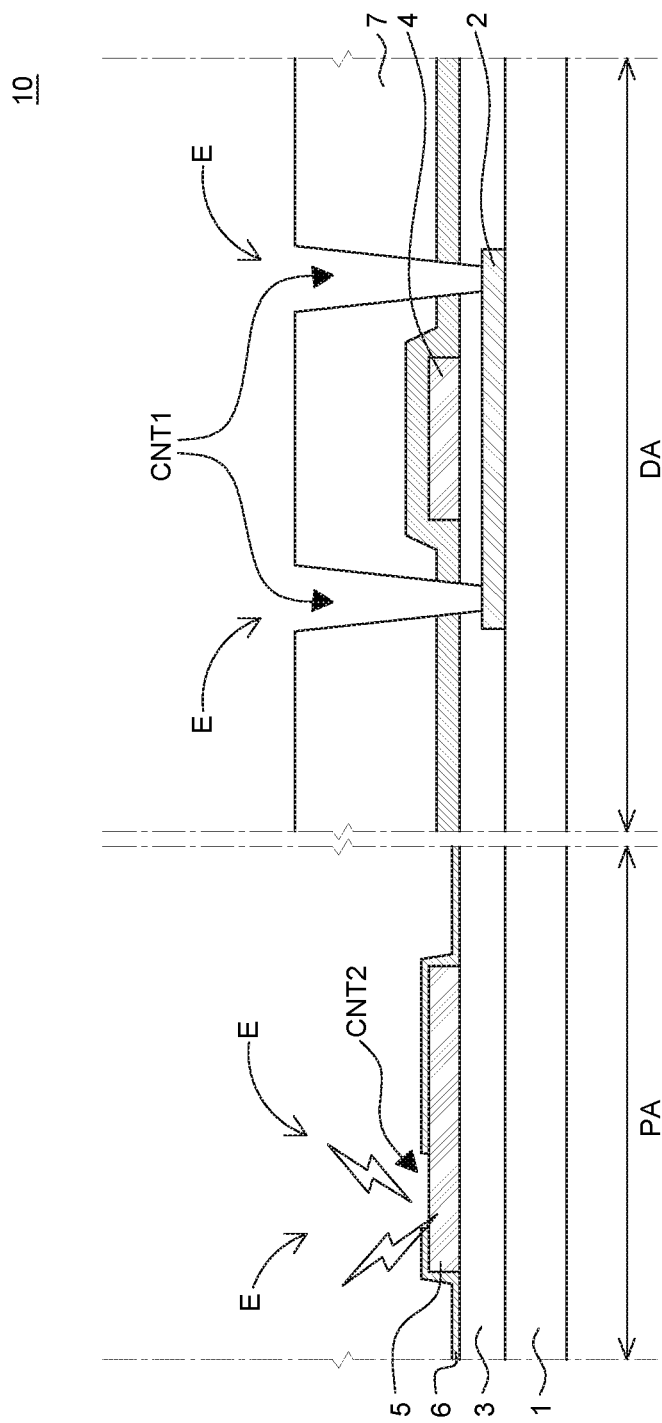
FIG. 1 is a cross-sectional view provided to explain a typical display apparatus and a method of manufacturing the same.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure.

The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When the time sequence between two or more incidents is described using the terms such as "after", "subsequent to", "next to", and "before", two or more incidents may be inconsecutive unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely bonded to or combined with each other and can be interlocked and operated in technically various ways, and the embodiments can be carried out independently of or in association with each other.

The exemplary embodiments of the present disclosure will be described in detail with reference to the accompanying drawings.

FIG. 3A through FIG. 3D are cross-sectional views provided to explain a method of manufacturing a display apparatus 30 according to a first exemplary embodiment of the present disclosure.

Referring to FIG. 3A through FIG. 3D, the method of manufacturing the display apparatus 30 according to the first exemplary embodiment of the present disclosure includes forming the active layer 2 in the display area DA of the substrate 1, respectively forming the gate electrode 4 and the pad electrode 5 in the display area DA and the pad area PA of the substrate 1, forming the second insulation layer 6 so as to cover the gate electrode 4 and the pad electrode 5, forming the planarization layer 7 on the second insulation layer 6, forming the first contact hole CNT1 in the planarization layer 7d and the second insulation layer 6 in the display area DA so as to expose a part of the active layer 2, and removing the planarization layer 7p in the pad area PA.

Figure 3A:
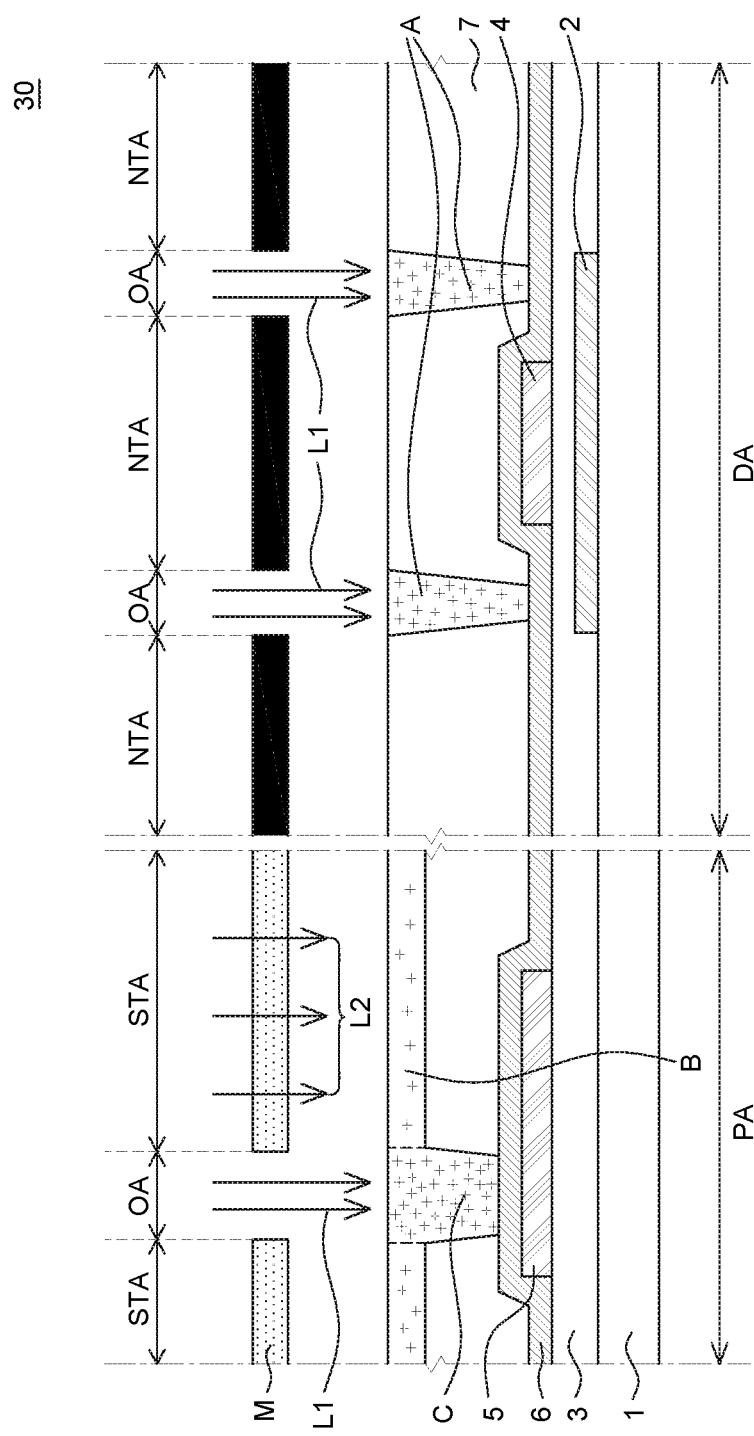
FIG. 3A through FIG. 3D are cross-sectional views provided to explain a method of manufacturing a display apparatus according to a first exemplary embodiment of the present disclosure.

FIG. 3A provides a cross-sectional view of the display apparatus 30 in a state where a process of from the forming of the active layer 2 in the display area DA of the substrate 1 to the forming of the planarization layer 7 so as to cover the gate electrode 4 and the pad electrode 5 is performed. Further, referring to FIG. 3A through FIG. 3D, the forming the first contact hole CNT1 in the planarization layer 7d in the display area DA and the second insulation layer 6 and the removing of the planarization layer 7p in the pad area PA will be described in detail.

Referring to FIG. 3A, the planarization layer 7 is formed so as to cover the gate electrode 4 in the display area DA and the pad electrode 5 in the pad area PA of the substrate 1.

The substrate 1 may be formed of an insulation material. For example, the substrate 1 may be a flexible film formed of glass or a polyimide-based material.

The gate electrode 4 and the pad electrode 5 may be formed of conductive materials. The gate electrode 4 and the pad electrode 5 may be formed of any one of molybdenum (Mo), aluminum (Al), chromium (Cr), gold (Au), titanium (Ti), nickel (Ni), neodymium (Nd), and copper (Cu), and alloys thereof, but are not limited thereto. The gate electrode 4 and the pad electrode 5 may be formed of various materials. Further, the gate electrode 4 and the pad electrode 5 may be formed at the same time through the same process, and may be formed of the same material.

The active layer 2 may be formed of any one of amorphous silicon (a-Si), polycrystalline silicon (poly-Si), oxide and organic materials according to a kind of the active layer 2, but is not limited thereto.

Each of the first insulation layer 3 and the second insulation layer 6 may include a single layer or a plurality of layers formed of inorganic materials. For example, the first insulation layer 3 and the second insulation layer 6 may be of silicon nitride ($SiN_x$) and silicon oxide ($SiO_2$).

The planarization layer 7 is configured to flatten upper surfaces of the plurality of layers disposed under the planarization layer 7. For example, the planarization layer 7 may be formed of organic materials such as photo acryl, poly aluminum chloride (PAC), and polyimide and etc.

A process using a mask M may be performed to remove portions of the planarization layer 7 respectively corresponding to a first contact hole for exposing a part of the active layer 2 and a second contact hole for exposing a part of the pad electrode 5. Specifically, the mask M including an open area OA, a semi-transparent area STA, and a non-transparent area NTA may be disposed on the planarization layer 7. Then, a part of the planarization layer 7 may be removed through an exposing process and a developing process.

The open area OA of the mask M corresponds to an area for the first contact hole in the display area DA and an area for the second contact hole in the pad area PA. The open area OA of the mask M is an area through which lights are directly projected during the exposing process. The open area OA may have a transmissivity of 100%.

The non-transparent area NTA of the mask M may correspond to the other area in the display area DA except the open area OA for forming the first contact hole. The non-transparent area NTA of the mask M is an area through which lights are not projected during the exposing process. The non-transparent area NTA may have a transmissivity of 0%.

The semi-transparent area STA of the mask M corresponds to the pad area PA. Specifically, the semi-transparent area STA of the mask M corresponds to the other area in the pad area PA except the open area OA for forming the second contact hole. The semi-transparent area STA has a lower transmissivity than the open area OA. The semi-transparent area STA is an area through which only some of lights are projected during the exposing process.

Referring to FIG. 3A, during the exposing process for forming the first contact hole and the second contact hole in the planarization layer 7, a light L1 is projected through the open area OA of the mask M. Thus, materials in an area A and an area C of the planarization layer 7 are changed. Further, a light L2 is projected through the semi-transparent area STA of the mask M. Thus, a material in an area B of the planarization layer 7 is changed. Herein, the amount of the light L2 projected through the semi-transparent area STA of the mask M is smaller than the amount of the light L1 projected through the open area OA of the mask M. Therefore, the areas A and C of the planarization layer 7 exposed to the light L1 through the open area OA of the mask M are formed more deeply than the area B of the planarization layer 7 exposed to the light L2 through the semi-transparent area STA of the mask M.

The areas A, B, and C of the planarization layer 7 exposed to the lights through the mask M are removed through the developing process. Specifically, the materials in the areas A, B, and C exposed to the lights through the mask M are changed and react with a development material (or developer). Further, the other portion of the planarization layer 7 which is not exposed to the lights does not react with the developer. Accordingly, during the developing process, the areas A, B, and C of the planarization layer 7 may be removed.

Figure 3B:
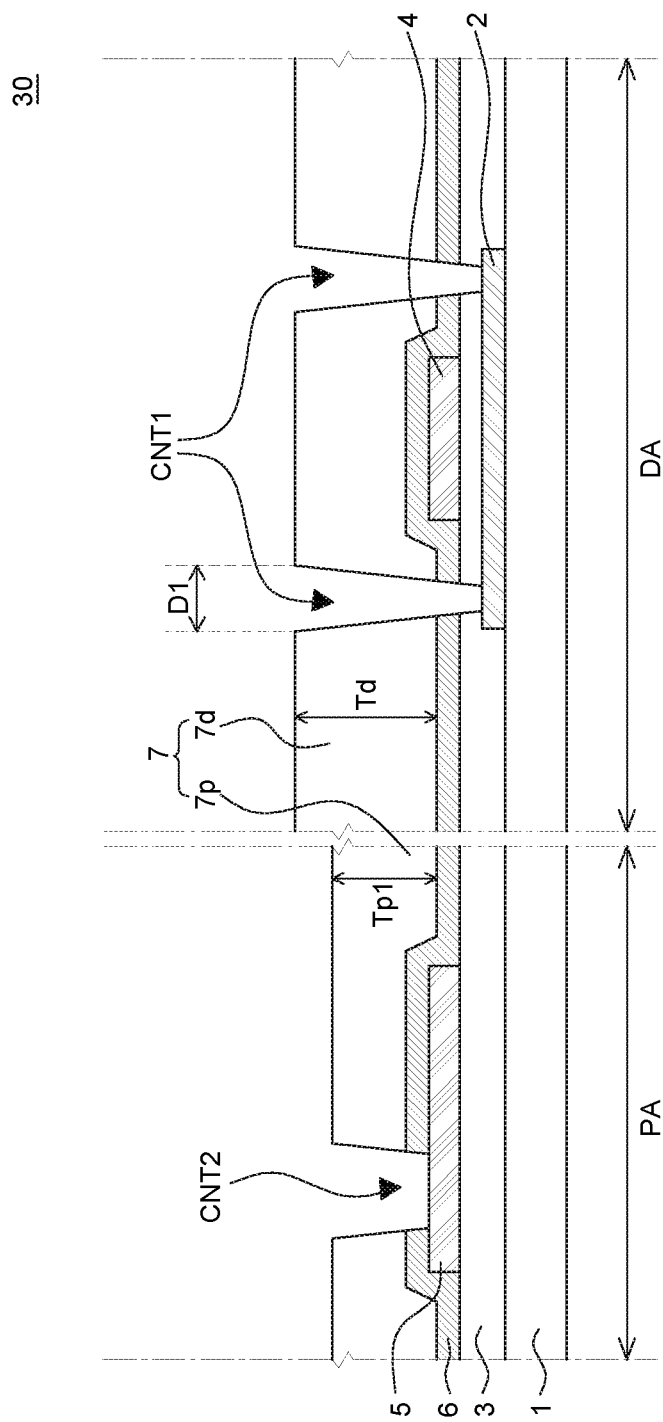

If a part of the planarization layer 7 is removed through the developing process, a thickness Tp1 of the planarization layer 7p in the pad area PA is smaller than a thickness Td of the planarization layer 7d in the display area DA, as illustrated in FIG. 3B. That is, in proportion to the amount of lights passing through the semi-transparent area STA of the mask M, the planarization layer 7p in the pad area PA is further removed than the planarization layer 7d in the display area DA corresponding to the non-transparent area NTA of the mask M. Therefore, the thickness Tp1 of the planarization layer 7p in the pad area PA is smaller than the thickness Td of the planarization layer 7d in the display area DA.

Then, the etching process for removing the first insulation layer 3 and the second insulation layer 6 exposed by the planarization layer 7 and corresponding to the first contact hole CNT1 and the second contact hole CNT2 is performed. Herein, the other portion of the second insulation layer 6 in the pad area PA except a portion corresponding to the second contact hole CNT2 is covered by the planarization layer 7p and thus not exposed through the etching process. Therefore, as compared with a conventional structure in which the planarization layer 7 is not formed in the pad area PA, an excessive decrease in thickness of the second insulation layer 6 in the pad area PA can be minimized. Thus, resultant damage to a surface of the pad electrode 5 can also be minimized.

Figure 3C:
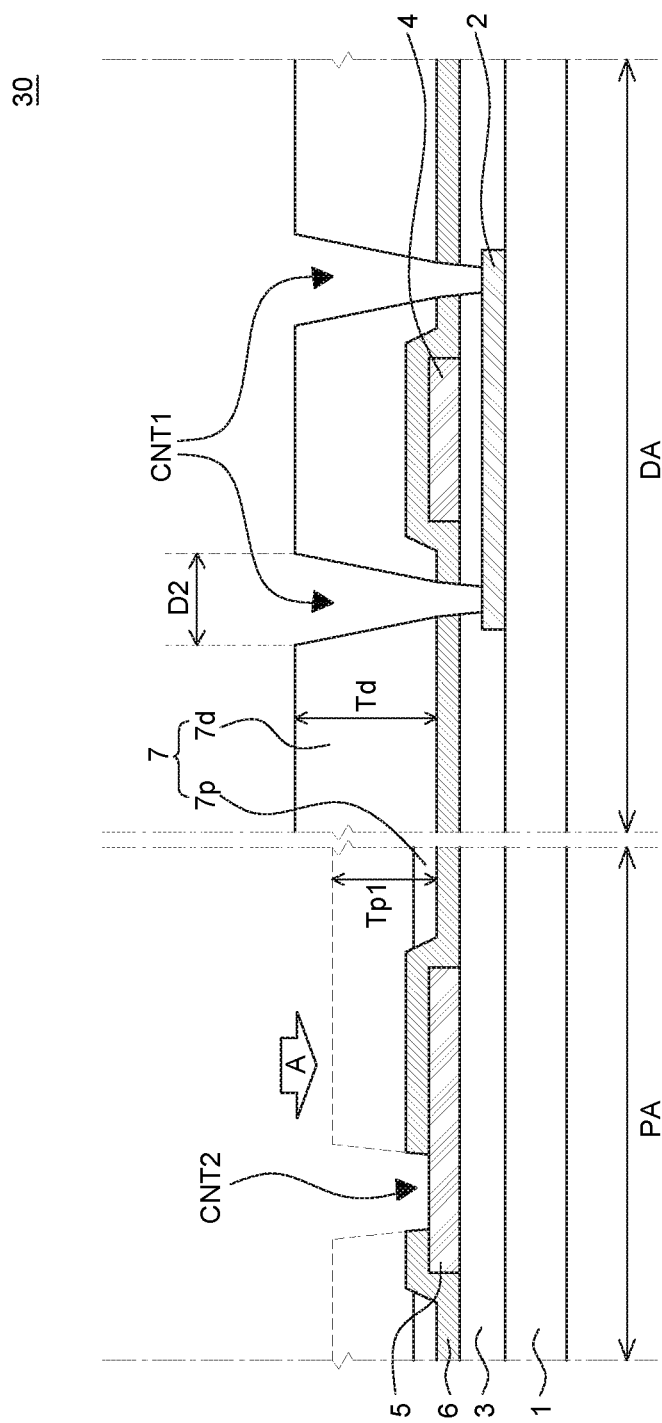

Referring to FIG. 3C, after the first contact hole CNT1 and the second contact hole CNT2 are formed, the planarization layer 7p in the pad area PA is removed through an ashing process A. As described above, if the planarization layer 7p in the pad area PA is not removed, while an external circuit is bonded to the pad electrode 5, there may be a contact error due to a thickness of the planarization layer 7p.

While the ashing process A is performed, the planarization layer 7p in the pad area PA may be removed using oxygen ($O_2$) and etc. A time for the ashing process A may be proportional to the thickness Tp1 of the planarization layer 7p in the pad area PA.

In the method of manufacturing the display apparatus 30 according to the first exemplary embodiment of the present disclosure, the thickness Tp1 of the planarization layer 7p in the pad area PA is set to be smaller than the thickness Td of the planarization layer 7d in the display area DA using the mask M including the semi-transparent area STA corresponding to the pad area PA. Therefore, a time for the ashing process A can be decreased as compared with a structure in which the planarization layer 7p in the pad area PA is formed using the mask M without including the semi-transparent area STA. The structure is a structure in which the thickness Tp1 of the planarization layer 7p in the pad area PA is the same as the thickness Td of the planarization layer 7d in the display area DA.

As the time for the ashing process A for removing the planarization layer 7p in the pad area PA is decreased, a time for exposing the first contact hole CNT1 in the display area DA to a gas such as oxygen ($O_2$) and others is also decreased. Therefore, it is possible to suppress an increase in size of the first contact hole CNT1. In other words, a difference between a maximum diameter D1 of the first contact hole CNT1 before the ashing process A and a maximum diameter D2 of the first contact hole CNT1 after removing the planarization layer 7p in the pad area PA by the ashing process A may be smaller than a difference between maximum diameters of the first contact hole before and after the ashing process A in a structure in which the planarization layer 7p in the pad area PA is formed using the mask M without including the semi-transparent area STA.

Accordingly, it is possible to suppress an excessive increase in size of the first contact hole CNT1 as compared with a design value and thus possible to reduce occurrence of resultant defects. For example, in the display apparatus 30, a structure such as a column spacer for maintain a cell gap of a liquid crystal layer included in the display apparatus 30 may be disposed in a peripheral area of the first contact hole CNT1. In this case, if a size of the first contact hole CNT1 is excessively increased, the structure may sink into the first contact hole CNT1. Thus, the structure may be out of alignment, which is called "gap error". In the first exemplary embodiment of the present disclosure, the thickness Tp1 of the planarization layer 7p in the pad area PA is smaller than the thickness Td of the planarization layer 7d in the display area DA. Thus, it is possible to suppress an excessive increase in size of the first contact hole CNT1. Therefore, process defects, such as a gap error, of the display apparatus 30 can also be reduced. Further, as the time for the ashing process A is decreased, a time for exposing the pad electrode 5 to a gas such as oxygen ($O_2$) and others through the second contact hole CNT2 in the pad area PA is also decreased. Therefore, it is possible to reduce damage to the pad electrode 5.

Figure 3D:
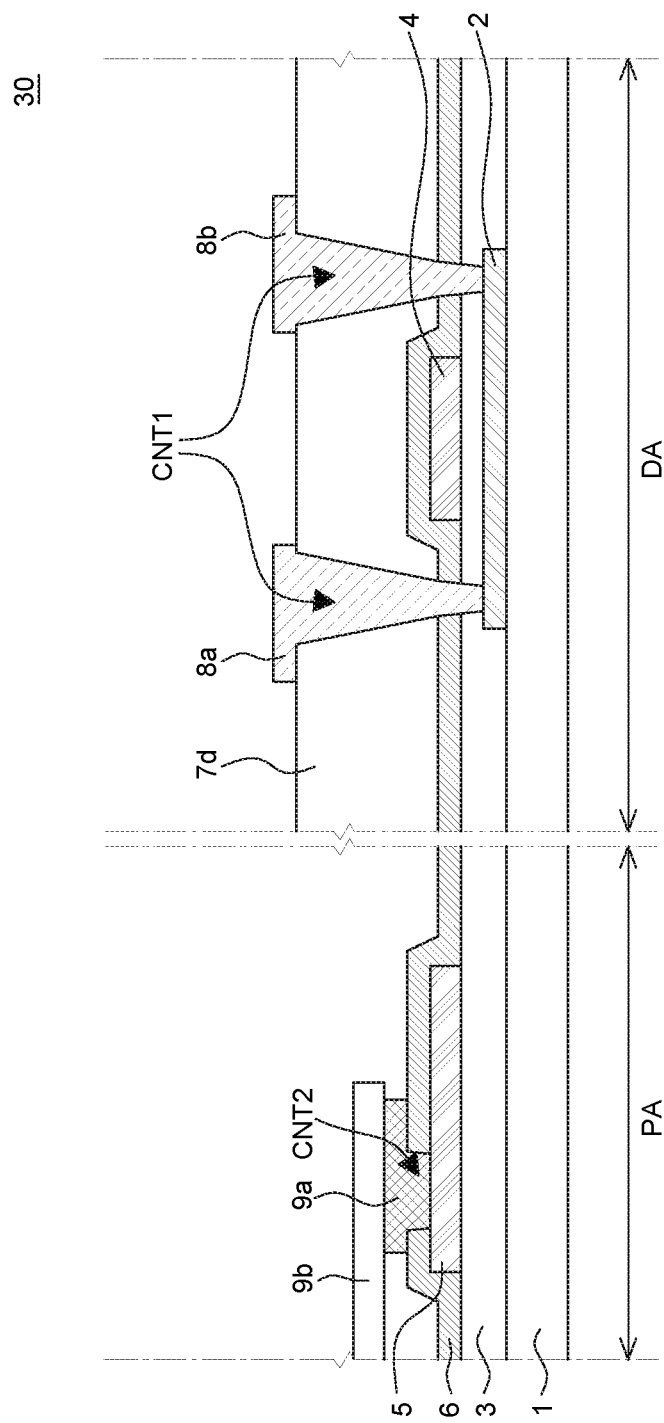

Referring to FIG. 3D, after the planarization layer 7p in the pad area PA is removed by the ashing process A, a source electrode 8a and a drain electrode 8b of a TFT are in contact with the active layer 2 through the first contact hole CNT1 in the display area DA. Further, an external circuit 9b is bonded to the pad electrode 5 through the second contact hole CNT2 in the pad area PA. An adhesive 9a may be disposed between the external circuit 9b and the pad electrode 5.

The external circuit 9b is bonded to the pad electrode 5 by the adhesive 9a, and configured to supply or transfer various signals to the display area DA. The external circuit 9b may be, for example, a printed circuit board (PCB) or a flexible printed circuit board (FPCB).

The adhesive 9a fixes the external circuit 9b to the pad electrode 5, and may be formed of resin including conductive balls for electrical conduction. The adhesive 9a may be, for example, an anisotropic conductive film (ACF).

The source electrode 8a and the drain electrode 8b of the TFT are electrically connected to the active layer 2 through the first contact hole CNT1. Herein, a maximum diameter of the first contact hole CNT1 has a size considering an increase in maximum diameter of the first contact hole CNT1 during the above-described process for removing the planarization layer 7p in the pad area PA. In other words, the maximum diameter of the first contact hole CNT1 has a size determined by the process for removing the planarization layer 7p in the pad area PA after the planarization layer 7p in the pad area PA is formed to have a smaller thickness than that of the planarization layer 7d in the display area DA. The maximum diameter of the first contact hole CNT1 determined as such is smaller than a size determined by a process for removing the planarization layer 7p in the pad area PA after the planarization layer 7p in the pad area PA is formed to have the same thickness as the planarization layer 7d in the display area DA.

Therefore, the size of the first contact hole CNT1 is not excessively increased during the process. Accordingly, process defects, such as a gap error and etc., of the display apparatus 30 can be reduced. Further, during the etching process for forming the contact holes CNT1 and CNT2, the planarization layer 7p is disposed on the second insulation layer 6 in the pad area PA. Thus, damage to the second insulation layer 6 in the pad area PA or the pad electrode 5 caused by the etching process can be reduced. Therefore, it is possible to suppress a decrease in adhesion between the external circuit 9b and the pad electrode 5. Accordingly, driving defects of the display apparatus 30 can be reduced.

In FIG. 3A through FIG. 3D, the planarization layer 7 is illustrated as being formed of a positive photo resist material. However, the planarization layer 7 may be formed of a negative photo resist material. If the planarization layer 7 is formed of a positive photo resist material, a portion through which lights are projected through the mask is removed but a portion through which lights are not projected remains. On the other hand, if the planarization layer 7 is formed of a negative photo resist material, the portion through which lights are projected remains but the portion through which lights are not projected is removed through a developing process. Therefore, if the planarization layer 7 is formed of a negative photo resist material, the non-transparent area NTA may include portions for forming the first contact hole CNT1 and the second contact hole CNT2. Further, the open area OA may include the other portion required to remain, i.e., a portion in the display area DA which does not correspond to the first contact hole CNT1. Furthermore, a transmissivity of the semi-transparent area STA corresponding to the pad area PA may be determined considering the thickness Tp1 of the planarization layer 7p in the pad area PA.

FIG. 4A through FIG. 4D are cross-sectional views provided to explain a method of manufacturing a display apparatus 40 according to a second exemplary embodiment of the present disclosure. Further, detailed description about the components identical or corresponding to those of the above-described exemplary embodiment will be omitted for convenience in explanation.

Figure 4A:
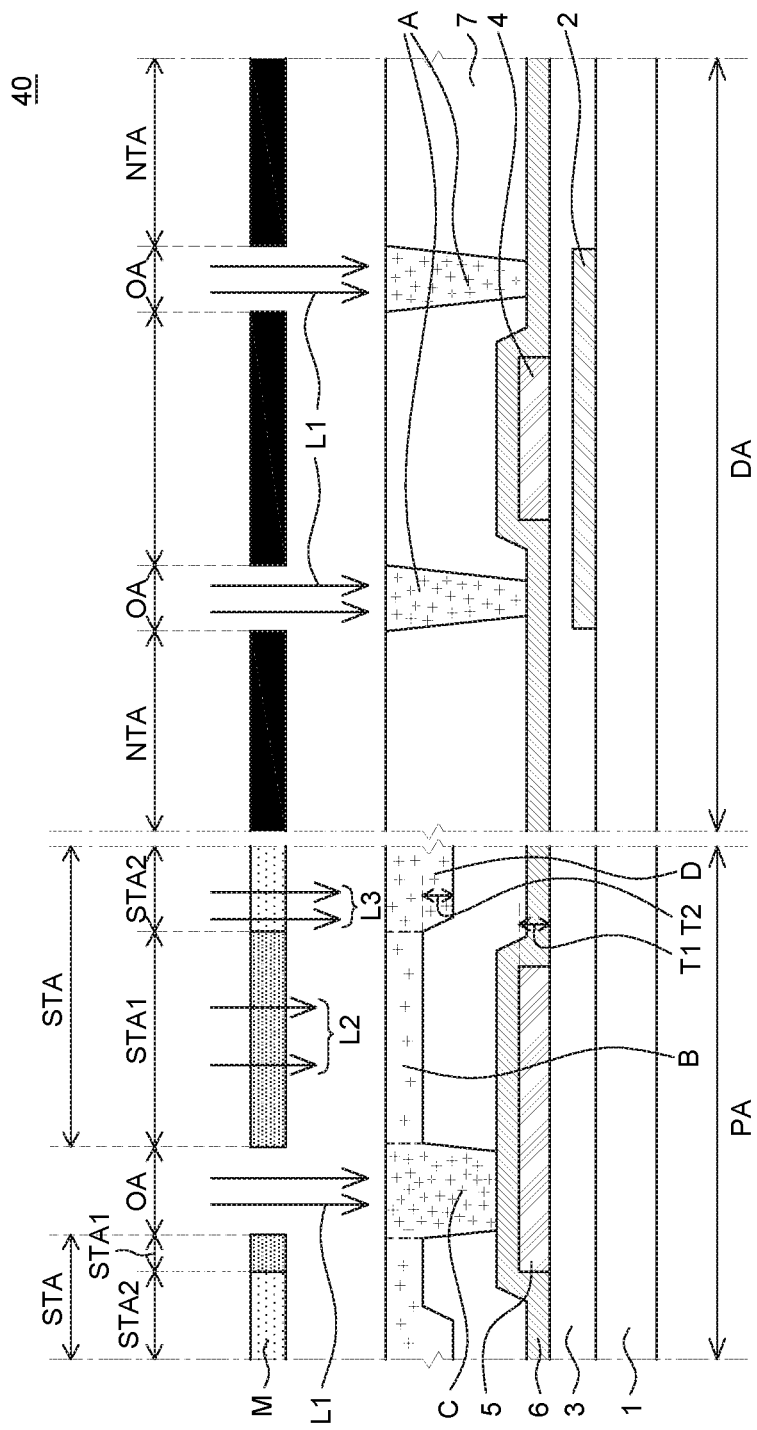
FIG. 4A through FIG. 4D are cross-sectional views provided to explain a method of manufacturing a display apparatus according to a second exemplary embodiment of the present disclosure.

FIG. 4A provides a cross-sectional view of the display apparatus 40 in a state where a process of from the forming of the active layer 2 in the display area DA of the substrate 1 to the forming of the planarization layer 7 so as to cover the gate electrode 4 and the pad electrode 5 is performed.

Referring to FIG. 4A, a process using the mask M may be performed to remove portions of the planarization layer 7 respectively corresponding to a first contact hole for exposing the active layer 2 and the second contact hole for exposing the pad electrode 5. Specifically, the mask M including the open area OA, the semi-transparent area STA, and the non-transparent area NTA may be disposed on the planarization layer 7. Then, a part of the planarization layer 7 may be removed through an exposing process and a developing process.

The open area OA of the mask M corresponds to an area for forming the first contact hole in the display area DA and an area for the second contact hole in the pad area PA. The open area OA of the mask M is an area through which lights are directly projected during the exposing process. The open area OA may have a transmissivity of 100%.

The non-transparent area NTA of the mask M may correspond to the other area in the display area DA except the open area OA for forming the first contact hole. The non-transparent area NTA of the mask M is an area through which lights are not projected during the exposing process. The non-transparent area NTA may have a transmissivity of 0%.

The semi-transparent area STA of the mask M corresponds to the pad area PA, and includes a first semi-transparent area STA1 and a second semi-transparent area STA2. The semi-transparent area STA of the mask M is an area through which only some of lights are projected during the exposing process.

The first semi-transparent area STA1 corresponds to at least a part of the pad electrode 5. Specifically, the first semi-transparent area STA1 corresponds to the other area in the pad electrode 5 except the open area OA for forming the second contact hole.

The second semi-transparent area STA2 has a higher transmissivity than the first semi-transparent area STA1, and corresponds to the other area in the pad area PA except the pad electrode 5.

Referring to FIG. 4A, during the exposing process for forming the first contact hole and the second contact hole in the planarization layer 7, the light L1 is projected through the open area OA of the mask M. Thus, materials in the area A and the area C of the planarization layer 7 are changed. Further, the light L2 is projected through the first semi-transparent area STA1 of the mask M. Thus, a material in the area B of the planarization layer 7 is changed. Furthermore, a light L3 is projected through the second semi-transparent area STA2 of the mask M. Thus, a material in an area D of the planarization layer 7 is changed. Herein, the second semi-transparent area STA2 has a higher transmissivity than the first semi-transparent area STA1. Thus, the amount of the light L3 projected to the planarization layer 7 through the second semi-transparent area STA2 is greater than the amount of the light L2 projected to the planarization layer 7 through the first semi-transparent area STA1. Further, the amount of the light L1 projected to the planarization layer 7 through the open area OA of the mask M is greater than the amount of the lights L2 and L3 projected to the planarization layer 7 through the first semi-transparent area STA1 and the second semi-transparent area STA2. Therefore, the areas A and C of the planarization layer 7 exposed to the light L1 through the open area OA are formed more deeply than the areas B and D of the planarization layer 7 exposed to the lights L2 and D3 through the first semi-transparent area STA1 and the second semi-transparent area STA2. Further, the area D of the planarization layer 7 exposed to the light L3 through the second semi-transparent area STA2 is formed more deeply than the area B of the planarization layer 7 exposed to the light L2 through the first semi-transparent area STA1.

The areas A, B, C, and D of the planarization layer 7 exposed to the lights through the mask M are removed through the developing process. Specifically, the materials in the areas A, B, C, and D exposed to the lights through the mask M are changed and react with a development material (or developer). Further, the other portion of the planarization layer 7 which is not exposed to the lights does not react with the developer. Accordingly, during the developing process, the areas A, B, C, and D of the planarization layer 7 may be removed.

Then, the etching process for removing the first insulation layer 3 and the second insulation layer 6 exposed by the planarization layer 7 and corresponding to the first contact hole CNT1 and the second contact hole CNT2 is performed. Herein, the other portion of the second insulation layer 6 in the pad area PA except a portion corresponding to the second contact hole CNT2 is covered by the planarization layer 7p and thus not exposed through the etching process. Therefore, as compared with the conventional structure in which the planarization layer 7 is not formed in the pad area PA, an excessive decrease in thickness of the second insulation layer 6 in the pad area PA can be minimized. Thus, resultant damage to a surface of the pad electrode 5 can also be minimized.

Figure 4B:
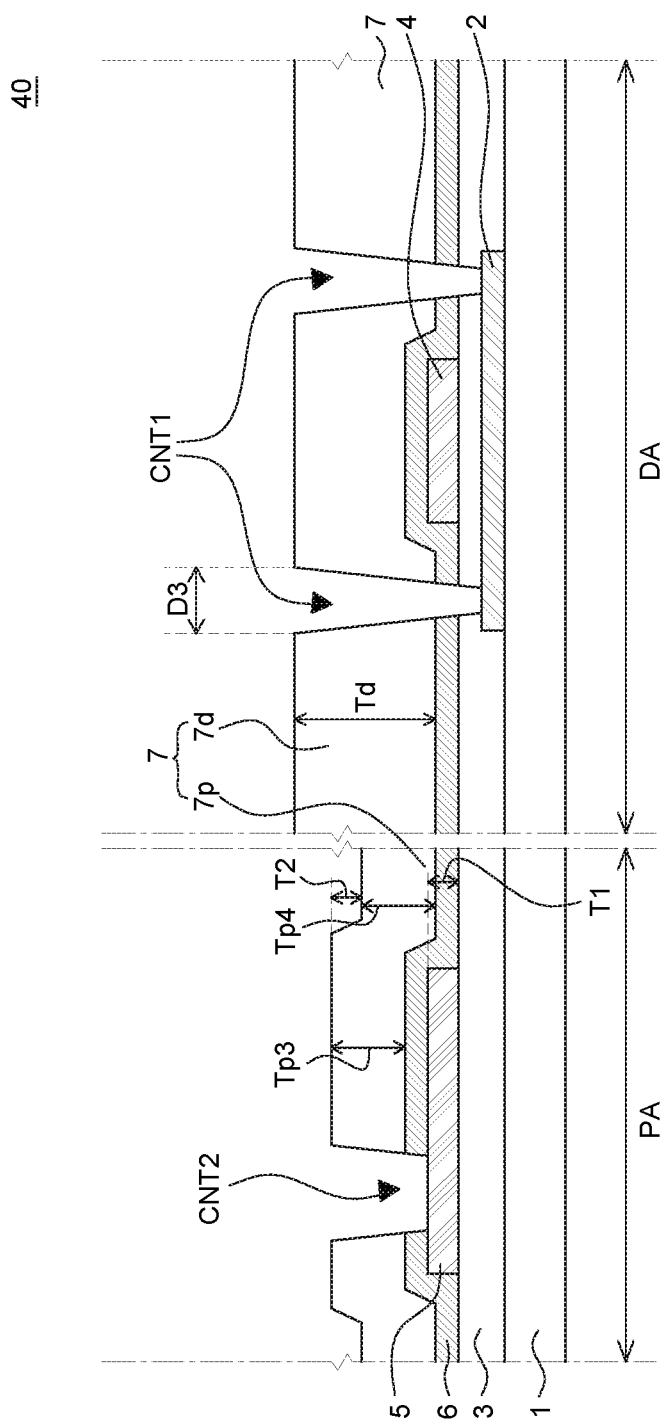

Meanwhile, if a part of the planarization layer 7 is removed through the developing process, thicknesses Tp3 and Tp4 of the planarization layer 7p in the pad area PA are smaller than the thickness Td of the planarization layer 7d in the display area DA, as illustrated in FIG. 4B. That is, in proportion to the amount of lights passing through the semi-transparent area STA of the mask M, the planarization layer 7p in the pad area PA is further removed than the planarization layer 7d in the display area DA corresponding to the non-transparent area NTA of the mask M. Therefore, the thicknesses Tp3 and Tp4 of the planarization layer 7p in the pad area PA are smaller than the thickness Td of the planarization layer 7d in the display area DA. Further, the second semi-transparent area STA2 of the mask M has a higher transmissivity than the first semi-transparent area STA1. Therefore, a portion of the planarization layer 7p in the pad area PA corresponding to the second semi-transparent area STA2 is further removed.

Herein, the transmissivity of the second semi-transparent area STA2 may be higher than the transmissivity of the first semi-transparent area STA1 by a value sufficient to further etch the planarization layer 7p by a thickness T1 of the pad electrode 5. Specifically, if the thickness T1 of the pad electrode 5 is 3,000 Å, the transmissivity of the second semi-transparent area STA2 is higher than the transmissivity of the first semi-transparent area STA1 by a value sufficient to further etch the planarization layer 7p by 3,000 Å. In other words, the amount of the light L3 projected through the second semi-transparent area STA2 is greater than the amount of the light L2 projected through the first semi-transparent area STA1 by a value sufficient to more deeply etch the planarization layer 7p by 3,000 Å. For example, if the thickness T1 of the pad electrode 5 is 3,000 Å, the transmissivity of the first semi-transparent area STA1 may be about 37% and the transmissivity of the second semi-transparent area STA2 may be about 42%. The transmissivity of the first semi-transparent area STA1 and the transmissivity of the second semi-transparent area STA2 may be determined on the basis of the thickness T1 of the pad electrode 5 considering the amount of lights, a material of the planarization layer, and the like.

Specifically, as illustrated in FIG. 4A, the area D exposed to the light L3 through the second semi-transparent area STA2 may be etched more deeply by the thickness T1 of the pad electrode 5 than the area B exposed to the light 2 through the first semi-transparent area STA1. In other words, as illustrated in FIG. 4B, a distance T2 from an upper surface of the planarization layer 7p which corresponds to the pad electrode 5 to an upper surface of the planarization layer 7p which does not correspond to the pad electrode may have substantially the same value as the thickness T1 of the pad electrode T1. That is, after a part of the planarization layer 7p is removed through the developing process, the thickness Tp3 of the planarization layer 7p which corresponds to the pad electrode 5 may be substantially the same as the thickness Tp4 of the planarization layer 7p which does not correspond to the pad electrode 5. Therefore, the thicknesses Tp3 and Tp4 of the planarization layer 7p in the pad area PA may be substantially uniform throughout the pad area PA.

Figure 4C:
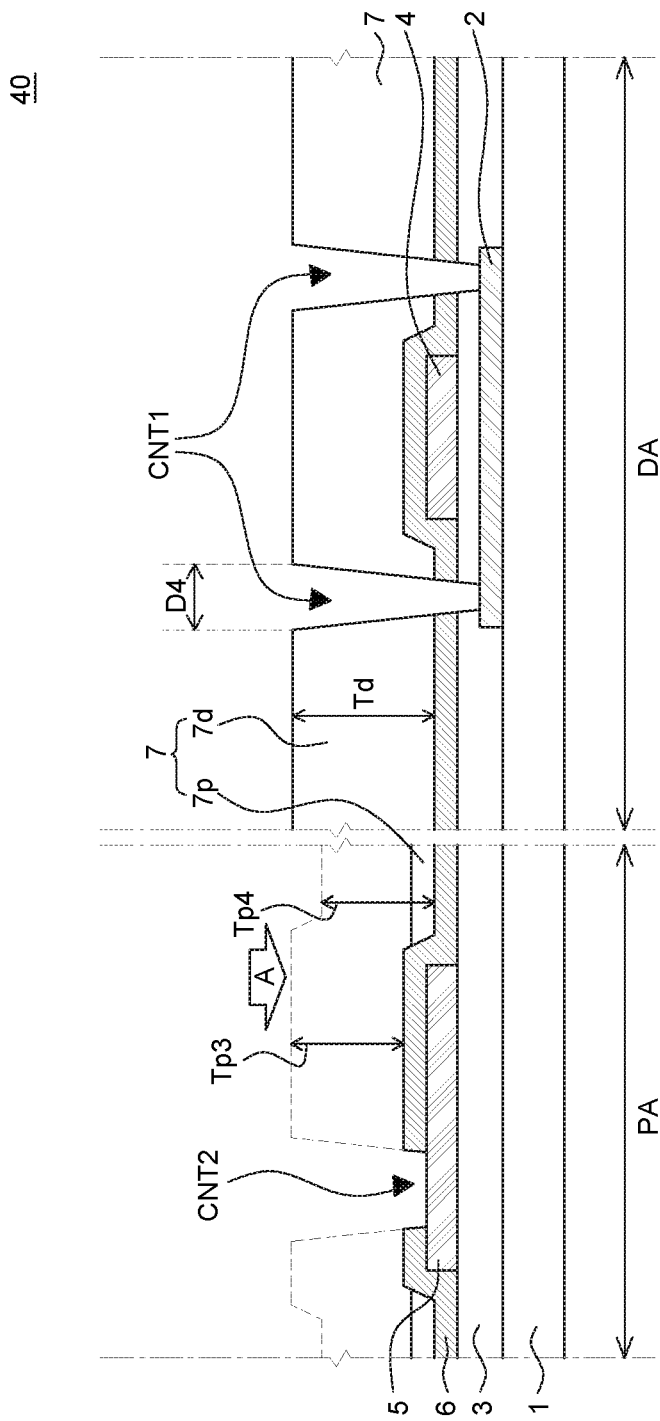

Referring to FIG. 4C, after the first contact hole CNT1 and the second contact hole CNT2 are formed, the planarization layer 7p in the pad area PA is removed through an ashing process A. While the ashing process A is performed, the planarization layer 7p in the pad area PA may be removed using oxygen (O₂) and etc. A time for the ashing process A may be proportional to the thicknesses Tp3 and Tp4 of the planarization layer 7p in the pad area PA.

In the method of manufacturing the display apparatus 40 according to the second exemplary embodiment of the present disclosure, the planarization layer 7p in the pad area PA is formed using the mask M including at least two semi-transparent areas STA1 and STA2 and considering the thickness T1 of the pad electrode 5. Therefore, the thicknesses Tp3 and Tp4 of the planarization layer 7p in the pad area PA are smaller than a thickness of the planarization layer 7p formed using the mask M without considering the thickness T1 of the pad electrode 5. In other words, a time for the ashing process A can be minimized as compared with a structure in which the planarization layer 7p is formed using the mask M without considering the thickness T1 of the pad electrode 5, for example, a structure in which a thickness of the planarization layer 7p in the pad area PA is the same as a thickness of the planarization layer 7d in the display area DA, or a structure in which a thickness of the planarization layer 7p in the pad area PA which does not correspond to the pad electrode 5 is greater than a thickness of the planarization layer 7p corresponding to the pad electrode 5.

Since the time for the ashing process A for removing the planarization layer 7p in the pad area PA is minimized, a time for exposing the first contact hole CNT1 in the display area DA to a gas such as oxygen (O₂) and others is also decreased. Therefore, it is possible to minimize an increase in size of the first contact hole CNT1. In other words, a difference between a maximum diameter D3 of the first contact hole CNT1 before the ashing process A illustrated in FIG. 4B and a maximum diameter D4 of the first contact hole CNT1 after removing the planarization layer 7p in the pad area PA by the ashing process A may be smaller than a difference between maximum diameters of the first contact hole before and after the ashing process A in a structure in which the planarization layer 7p in the pad area PA is formed using the mask M without including the semi-transparent area STA. Further, the difference between the maximum diameter D3 of the first contact hole CNT1 before the ashing process A and the maximum diameter D4 of the first contact hole CNT1 after removing the planarization layer 7p in the pad area PA by the ashing process A may be smaller than a difference between maximum diameters of the first contact hole before and after the ashing process A in a structure in which the planarization layer 7p in the pad area PA is formed using the mask M including one semi-transparent area.

Therefore, in the second exemplary embodiment of the present disclosure, the planarization layer 7p in the pad area PA is formed to have the uniform thicknesses Tp3 and Tp4 throughout the pad area PA using the mask M including at least two semi-transparent areas STA1 and STA2. Thus, it is possible to minimize an increase in size of the first contact hole CNT1. Therefore, process defects, such as a gap error, of the display apparatus 40 can also be reduced. Further, as the time for the ashing process A is minimized, a time for exposing the pad electrode 5 to a gas such as oxygen (O₂) and others through the second contact hole CNT2 in the pad area PA is also decreased. Therefore, it is possible to reduce damage to the pad electrode 5.

Figure 4D:
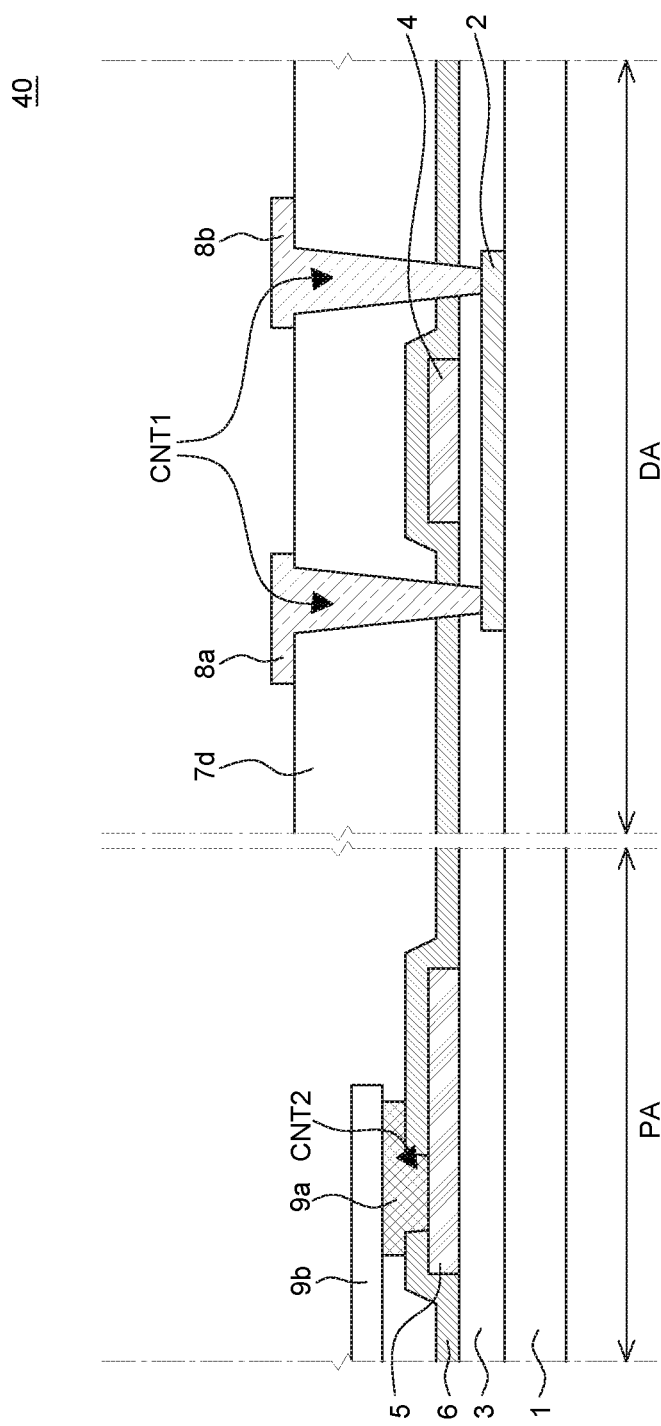

Referring to FIG. 4D, after the planarization layer 7p in the pad area PA is removed by the ashing process A, the source electrode 8a and the drain electrode 8b of the TFT are in contact with the active layer 2 through the first contact hole CNT1 in the display area DA. Further, the external circuit 9b is bonded to the pad electrode 5 through the second contact hole CNT2 in the pad area PA. The adhesive 9a may be disposed between the external circuit 9b and the pad electrode 5.

In FIG. 4A through FIG. 4D, the planarization layer 7 is illustrated as being formed of a positive photo resist material. However, the planarization layer 7 may be formed of a negative photo resist material. As described above, if the planarization layer 7 is formed of a negative photo resist material, the non-transparent area NTA may include portions for forming the first contact hole CNT1 and the second contact hole CNT2. Further, the open area OA may include the other portion required to remain, i.e., a portion in the display area DA which does not correspond to the first contact hole CNT1. Furthermore, a transmissivity of the first semi-transparent area STA1 and a transmissivity of the second semi-transparent area STA2 corresponding to the pad area PA may be determined considering the thicknesses Tp3 and Tp4 of the planarization layer 7p in the pad area PA.

FIG. 5 is a table comparing maximum diameters of a contact hole before and after removing a planarization layer in a pad area according to Comparative Example and Examples of the present disclosure.

Figure 2A:
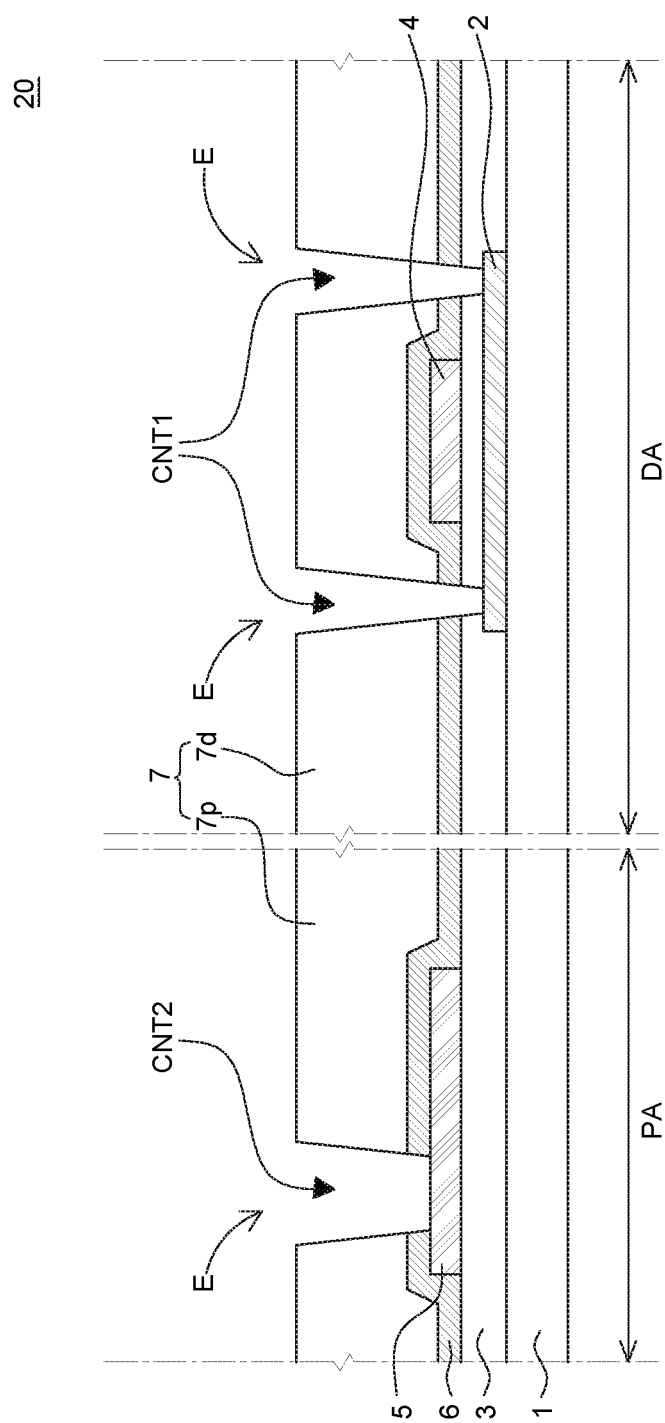
FIG. 2A and FIG. 2B are cross-sectional views provided to explain another typical display apparatus and a method of manufacturing the same.
Figure 2B:
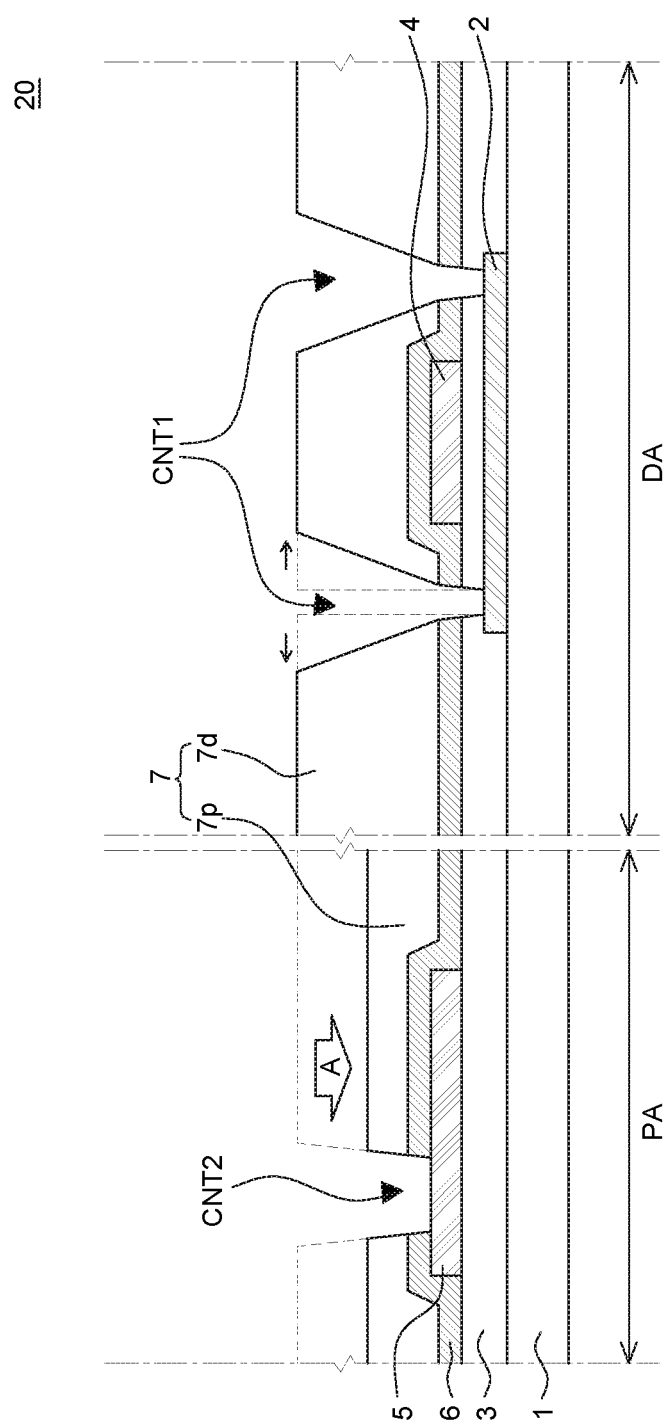

Comparative Example in FIG. 5 shows a structure, specifically the display apparatus 20 as illustrated in FIG. 2A and FIG. 2B, in which a thickness of a planarization layer in a pad area is the same as a thickness of a planarization layer in a display area. Referring to FIG. 5, if the planarization layer is formed using a mask without including a semi-transparent area, a size of the first contact hole CNT1 before removing the planarization layer in the pad area is 3.5 μm. Further, a maximum diameter of the first contact hole CNT1 in the display area after removing the planarization layer in the pad area by an ashing process is 5.5 μm. That is, through the ashing process, the size of the first contact hole CNT1 in the display area is increased by 2.0 μm as compared with the initial design value.

Example 1 in FIG. 5 shows a structure, specifically the display apparatus 30 as illustrated in FIG. 3A through FIG. 3D, in which a thickness of a planarization layer in a pad area is smaller than a thickness of a planarization layer in a display area. Referring to FIG. 5, if the planarization layer is formed using a mask including a semi-transparent area corresponding to the pad area, a size of the first contact hole CNT1 before removing the planarization layer in the pad area is 3.5 μm. Further, a maximum diameter of the first contact hole CNT1 in the display area after removing the planarization layer in the pad area by an ashing process is 4.15 μm. That is, while the planarization layer in the pad area is removed by the ashing process, the maximum diameter of the first contact hole CNT1 in the display area is increased by 0.65 μm as compared with the initial design value. Further, it can be seen that an increment in size of the first contact hole CNT1 is reduced as compared with the structure of Comparative Example in which the planarization layer is formed using the mask without including a semi-transparent area.

Example 2 in FIG. 5 shows a structure, specifically the display apparatus 40 as illustrated in FIG. 4A through FIG. 4D, in which a planarization layer has a uniform thickness throughout a pad area. Referring to FIG. 5, if the planarization layer is formed using a mask including at least two semi-transparent areas and considering a thickness of a pad electrode, a size of the first contact hole CNT1 before removing the planarization layer in the pad area is 3.5 µm. Further, a maximum diameter of the first contact hole CNT1 in the display area after removing the planarization layer in the pad area by an ashing process is 3.87 µm. That is, while the planarization layer in the pad area is removed by the ashing process, the maximum diameter of the first contact hole CNT1 in the display area is increased by 0.37 µm as compared with the initial design value. Further, it can be seen that an increment in size of the first contact hole CNT1 is further reduced as compared with the structure of Comparative Example in which the planarization layer is formed using the mask without including a semi-transparent area.

As described above, according to an exemplary embodiment of the present disclosure, if a planarization layer is formed using a mask including at least one semi-transparent area corresponding to a pad area, a time for an ashing process for removing the planarization layer in the pad area is decreased. Therefore, it is possible to improve an excessive increase in size of a first contact hole in a display area. Further, damage to an insulation layer in the pad area or a pad electrode can be reduced by the planarization layer in the pad area during an etching process for forming the first contact hole. Therefore, it is possible to reduce resultant driving defects of a display apparatus.

The exemplary embodiments of the present disclosure can also be described as follows:

According to an aspect of the present disclosure, a method of manufacturing a display apparatus includes forming an active layer in a display area of a substrate, respectively forming a gate electrode and a pad electrode in the display area and a pad area of the substrate, forming a planarization layer so as to cover the gate electrode and the pad electrode, forming a contact hole in the planarization layer so as to expose a part of the active layer, and removing the planarization layer in the pad area. The forming of the planarization layer includes forming the planarization layer in the pad area to have a smaller thickness than that of the planarization layer in the display area. Accordingly, it is possible to reduce damage to the pad electrode or an insulation layer in the pad area caused by an etching process. Further, it is possible to improve an excessive increase in size of a contact hole in the display area while the planarization layer in the pad area is removed.

The forming of the planarization layer may include forming the planarization layer in the pad area to have a thickness considering an increment in maximum diameter of the contact hole while the planarization layer in the pad area is removed.

A difference between a maximum diameter of the contact hole after the removing of the planarization layer in the pad area and a maximum diameter of the contact hole before the removing of the planarization layer in the pad area may be 0.65 µm or less.

The forming of the planarization layer may include using a mask including a semi-transparent area corresponding to the pad area to form the planarization layer in the pad area and the planarization layer in the display area to have different thicknesses.

The semi-transparent area of the mask may include a first semi-transparent area corresponding to at least a part of the pad electrode and a second semi-transparent area having a higher transmissivity than the first semi-transparent area.

A transmissivity of the second semi-transparent area may be higher than a transmissivity of the first semi-transparent area by a value sufficient to further etch the planarization layer by a thickness of the pad electrode.

A difference between a maximum diameter of the contact hole after the removing of the planarization layer in the pad area and a maximum diameter of the contact hole before the removing of the planarization layer in the pad area may be 0.37 µm or less.

The forming of the planarization layer may include forming the planarization layer in the pad area such that a thickness of the planarization layer corresponding to the pad electrode is the same as a thickness of the planarization layer which does not correspond to the pad electrode.

According to an aspect of the present disclosure, a display apparatus includes a substrate including a display area and a pad area, an active layer in the display area of the substrate, a pad electrode in the pad area of the substrate, and a planarization layer on the active layer and the pad electrode and including a contact hole for exposing a part of the active layer. A maximum diameter of the contact hole has a size considering an increase in maximum diameter of the contact hole while the planarization layer in the pad area is removed after the planarization layer is formed on the display area and the pad area. The maximum diameter of the contact hole is 4.15 µm or less. Accordingly, it is possible to minimize an increase in size of the contact hole in the display area while the planarization layer is removed. Thus, it is possible to reduce process defects, such as a gap error and etc., of the display apparatus. Further, it is possible to minimize damage to the pad electrode while the planarization layer is removed. Thus, it is possible to reduce driving defects of the display apparatus caused by the damage.

The maximum diameter of the contact hole may be determined by a process for removing the planarization layer in the pad area after the planarization layer in the pad area is formed to have a smaller thickness than that of the planarization layer in the display area.

While the planarization layer in the pad area is removed, the maximum diameter of the contact hole may be increased by 0.65 µm or less.

The planarization layer may be formed using a mask including at least one semi-transparent area corresponding to the pad area such that a thickness of the planarization layer in the pad area is smaller than a thickness of the planarization layer in the display area.

The semi-transparent area of the mask may include a first semi-transparent area corresponding to at least a part of the pad electrode and a second semi-transparent area having a higher transmissivity than the first semi-transparent area.

While the planarization layer in the pad area is removed, the maximum diameter of the contact hole may be increased by 0.37 µm or less.

The display apparatus may further include a source electrode or a drain electrode connected to the active layer through the contact hole.

According to exemplary embodiments of the present disclosure, a planarization layer in a pad area is formed to have a smaller thickness than that of a planarization layer in a display area. Thus, it is possible to reduce damage to a pad electrode or an insulation layer in the pad area caused by an etching process. Further, it is possible to improve an excessive increase in size of a contact hole formed in the display area while the planarization layer in the pad area is removed.

Accordingly, it is possible to suppress a decrease in adhesion between an external circuit and the pad electrode caused by damage to the pad electrode. Therefore, it is possible to reduce resultant driving defects of the display apparatus.

Further, according to an exemplary embodiment of the present disclosure, the planarization layer in the pad area has a shape and a thickness considering a thickness of the pad electrode formed in the pad area. Therefore, it is possible to minimize an increase in size of the contact hole in the display area while the planarization layer is removed. Accordingly, it is possible to reduce process defects, such as a gap error, of the display apparatus.

Furthermore, it is possible to minimize damage to the pad electrode while the planarization layer is removed. Thus, it is possible to improve a decrease in adhesion between the external circuit and the pad electrode. Accordingly, it is possible to reduce resultant driving defects of the display apparatus.

It will be apparent to those skilled in the art that various modifications and variations can be made in the display apparatus and method of manufacturing the same of the present disclosure without departing from the spirit or scope of the disclosure. Thus, it is intended that the present disclosure cover the modifications and variations of this disclosure provided they come within the scope of the appended claims and their equivalents.

What is claimed is:

1. A method of manufacturing a display apparatus, comprising:
    forming an active layer in a display area of a substrate;
    forming a gate electrode and a pad electrode in the display area and a pad area of the substrate, respectively;
    forming a first insulation layer so as to cover the gate electrode and the pad electrode;
    forming a planarization layer so as to cover the gate electrode and the pad electrode;
    forming a first contact hole in the planarization layer so as to expose a part of the active layer;
    forming a second contact hole in the first insulation layer so as to expose a part of the pad electrode; and
    removing the planarization layer in the pad area through an ashing process,
    wherein the forming of the first contact hole includes reducing a thickness of the planarization layer in the pad area to have a smaller thickness than the thickness of the planarization layer in the display area.

2. The method of manufacturing a display apparatus according to claim 1, wherein the forming of the first contact hole includes reducing of the thickness the planarization layer in the pad area to have a thickness considering an increment in maximum diameter of the first contact hole while the planarization layer in the pad area is removed.

3. The method of manufacturing a display apparatus according to claim 1, wherein a difference between a maximum diameter of the first contact hole after the removing of the planarization layer in the pad area and a maximum diameter of the first contact hole before the removing of the planarization layer in the pad area is 0.65 µm or less.

4. The method of manufacturing a display apparatus according to claim 1, wherein the reducing of the thickness of the planarization layer includes using a mask including a semi-transparent area corresponding to the pad area to form the planarization layer in the pad area and the planarization layer in the display area to have different thicknesses.

5. The method of manufacturing a display apparatus according to claim 4, wherein the semi-transparent area of the mask includes a first semi-transparent area corresponding to at least a part of the pad electrode and a second semi-transparent area having a higher transmissivity than the first semi-transparent area.

6. The method of manufacturing a display apparatus according to claim 5, wherein a transmissivity of the second semi-transparent area is higher than a transmissivity of the first semi-transparent area by a value sufficient to further etch the planarization layer by a thickness of the pad electrode.

7. The method of manufacturing a display apparatus according to claim 5, wherein a difference between a maximum diameter of the contact hole after the removing of the planarization layer in the pad area and a maximum diameter of the contact hole before the removing of the planarization layer in the pad area is 0.37 µm or less.

8. The method of manufacturing a display apparatus according to claim 5, wherein the forming of the planarization layer includes forming the planarization layer in the pad area such that a thickness of the planarization layer at a region corresponding to the pad electrode is the same as a thickness of the planarization layer at regions which do not correspond to the pad electrode.

9. The method of manufacturing a display apparatus according to claim 1, further comprising:
    removing the second insulation layer exposed by the planarization layer corresponding to the first contact hole and the second contact hole.

10. The method of manufacturing a display apparatus according to claim 1, wherein the first contact hole and the second contact hole are formed at the same time through a developing process to the planarization layer.

11. The method of manufacturing a display apparatus according to claim 1, wherein the maximum diameter of the first contact hole after the removing the planarization layer in the pad area is 4.15 µm or less.

12. The method of manufacturing a display apparatus according to claim 4, wherein the thickness of the planarization layer in the pad area is substantially uniform.

* * * * *